(12) United States Patent
Low (10) Patent No.: US 7,096,147 B1
(45) Date of Patent: Aug. 22, 2006

(54) APPARATUS AND METHOD FOR CORRELATING THE AIR FLOW VELOCITY IN AN ENVIRONMENTAL CHAMBER TO A RACK ASSEMBLY

(75) Inventor: Andrew G. Low, Southlake, TX (US)

(73) Assignee: Tellabs Bedford, Inc., Bedford, TX (US)

( * ) Notice: Subject to any disclaimer, the term of this patent is extended or adjusted under 35 U.S.C. 154(b) by 0 days.

(21) Appl. No.: 10/997,776

(22) Filed: Nov. 24, 2004

(51) Int. Cl.
*G01K 1/08* (2006.01)
(52) U.S. Cl. ...................................... 702/132
(58) Field of Classification Search ................ 702/132
See application file for complete search history.

(56) References Cited

U.S. PATENT DOCUMENTS 6,024,165 A * 2/2000 Melane et al. ......... 165/104.33
6,337,630 B1 * 1/2002 Hass et al. ................... 340/606
2005/0267639 A1 * 12/2005 Sharma et al. .............. 700/276

* cited by examiner

*Primary Examiner*—John Barlow
*Assistant Examiner*—Demetrius Pretlow
(74) *Attorney, Agent, or Firm*—Pillsbury Winthrop Shaw Pittman LLP (57) ABSTRACT

A system and method are disclosed for measuring the airflow velocity within a chamber in order to qualify electronic equipment based on airflow velocity in combination with temperature rating. Furthermore, a system and method are disclosed for measuring and monitoring the airflow velocity at various positions within an equipment assembly rack during operation in order to determine the position of and eliminate hot-spots that occur based on temperature and airflow velocity tolerance parameters.

20 Claims, 6 Drawing Sheets

APPARATUS AND METHOD FOR CORRELATING THE AIR FLOW VELOCITY IN AN ENVIRONMENTAL CHAMBER TO A RACK ASSEMBLY

BACKGROUND

In order to determine performance characteristic for a particular electronic device, certain environmental situations are simulated under controlled testing conditions. For example, an electronic device containing electrical components and circuits used in a telecommunications system are tested in an environmental chamber. The environmental chamber is capable of simulating temperature extremes as well as temperature ranges similar to those that actually exist out in the field where the equipment is deployed. Under these testing conditions, the telecommunication system is tested for Bit Error Rates (BERs) caused by the extreme temperature conditions as well as the temperature fluctuations.

Under these testing conditions, large fans are deployed in the environmental chamber, similar to the fans used in the field, to circulate the air around the equipment for rapid temperature changes. Typical testing conditions measure for or are based on measurements of circuit temperatures. As a result, the testing conditions typically do not accurately reflect the actual working conditions, especially when the electronic device is assembled in the field within a card assembly shelf. More specifically, actual assembly of the electronic device within the in the field is impacted by the relative position of the electronic device with respect to the location of the circulating fan. For example, if an equipment is tested in an environmental chamber in a position that is close to the fans that are used to circulate the air and then installed in the field in a position that is further from the fans, then the testing parameters under which the equipment is qualified or certified will not reflect the actual parameters under which the equipment is deployed. This is predominantly because the parameters under which the equipment is tested and certified is dependent upon temperature ratings, which can vary from one location in the rack assembly to another location due in part to the fact that heat dissipation is based on temperature of the ambient air as well as the rate of airflow.

The rate of heat dissipated from a circuit is a function of airflow velocity. Thus, when the card is installed in a rack for its intended use the airflow velocity may be less than the airflow in the environmental testing chamber. Thus, the conditions under which the circuit was qualified will not be the same as the conditions that actually exist in the field because of the changes in the airflow rate in certain areas; these areas are often referred to as "hot-spots". Typically hot-spots occur when the airflow, which is induced by fans, varies significantly with the cross-section of the card cage or rack assembly. Equipment mounted in a rack may have large gaps between the top of the assembly and the bottom. Air will find the path of least resistance, which would be out of the front and or sides of the assembly rather than through the circuit components. For example, when an equipment that allows only side-to-side airflow is placed upstream from an equipment that requires vertical airflow, the air supply to the downstream equipment is choked. Thus, although the overall temperature reading in the field for any rack or chamber may be within the temperature limits that the circuit was qualified for, the BER may still exceed the limits that the equipment was qualified or certified at because the operating temperature of the chamber at the particular location of the equipment can actually exceed the qualification temperature due to the "hot-spots" caused by inadequate airflow velocity.

Therefore, what is needed is a system and method for qualifying electronic circuits based on airflow velocity in combination with temperature rating. Furthermore, what is needed is a system and method for measuring and monitoring the airflow velocity at various positions within the rack during operation in the field in order to determine the position of and eliminate hot-spots.

SUMMARY

A system and method are disclosed that measure the airflow velocity within a chamber in order to qualify electronic equipment based on airflow velocity in combination with temperature rating. Furthermore, a system and method are disclosed for measuring and monitoring the airflow velocity at various positions within an equipment assembly rack during operation in order to determine the position of and eliminate hot-spots that occur based on temperature and airflow velocity tolerance parameters.

The systems and methods disclosed in accordance with the present invention also allow for an assembler or equipment installer that installs equipment within the field to ensure that the airflow meets or exceeds the airflow specifications for any particular equipment. The equipment installer would use an airflow sensor, as disclosed herein, to measure airflow velocity and ensure that the equipment specifications are met. Furthermore, if a problem arises within a rack assembly, equipment installers can locate the cause of the problem using the airflow sensors. Once the hot-spots in the rack assembly have been located using the airflow sensors, corrective action can be taken to eliminate the hot-spots.

DETAILED DESCRIPTION

A telecommunication system includes a signal processing system. Within that signal processing system several assemblies may be arranged in racks, cabinets or environmental chambers. Various embodiments of the present invention may find particular application, for example, during evaluation and/or qualification of a signal processing system to be used in optical communication systems. Optical systems offer a potentially large bandwidth as compared to copper-based systems. A broadband optical access system may be used, for example, to distribute a variety of broadband and narrowband communication services from a service provider's facility to a local distribution point and/or directly to the customer premises. These communication services may include telephone (e.g. POTS, VoIP, VoATM), data (e.g. ISDN, Ethernet), and/or video/audio (e.g. television, CATV, PPV, VoD) services. Because electronic and electro-mechanical devices tend to produce heat during operation, and because such devices (or other devices that may be found in the system, such as optical or opto-electronic devices) are typically susceptible to damage, malfunction, or otherwise altered operation when overheated, it is common to provide a temperature regulated room or environment in which to house the racks. However, the housing in which the equipment is contained may tend to insulate the equipment itself from the temperature regulated ambient air, thereby reducing the effectiveness of the temperature control system. For the purposes of most embodiments of the present invention, heat-related errors can be considered to be of primary importance. Accordingly, fans are used to increase air-flow.

Fans remove heat from components essentially by convection. In particular, the total heat removal H can be expressed as $A*C*\Delta T$, where A denotes the surface area of the component, C denotes a convection coefficient, and $\Delta T$ denotes a difference in temperature between the component surface and the air flowing by that surface. The convection coefficient C, in turn, may be defined by factors such as the heat conductivity, density and viscosity of the air, the length of the object transferring heat and the velocity of the airflow contacting the object.

Figure 1:
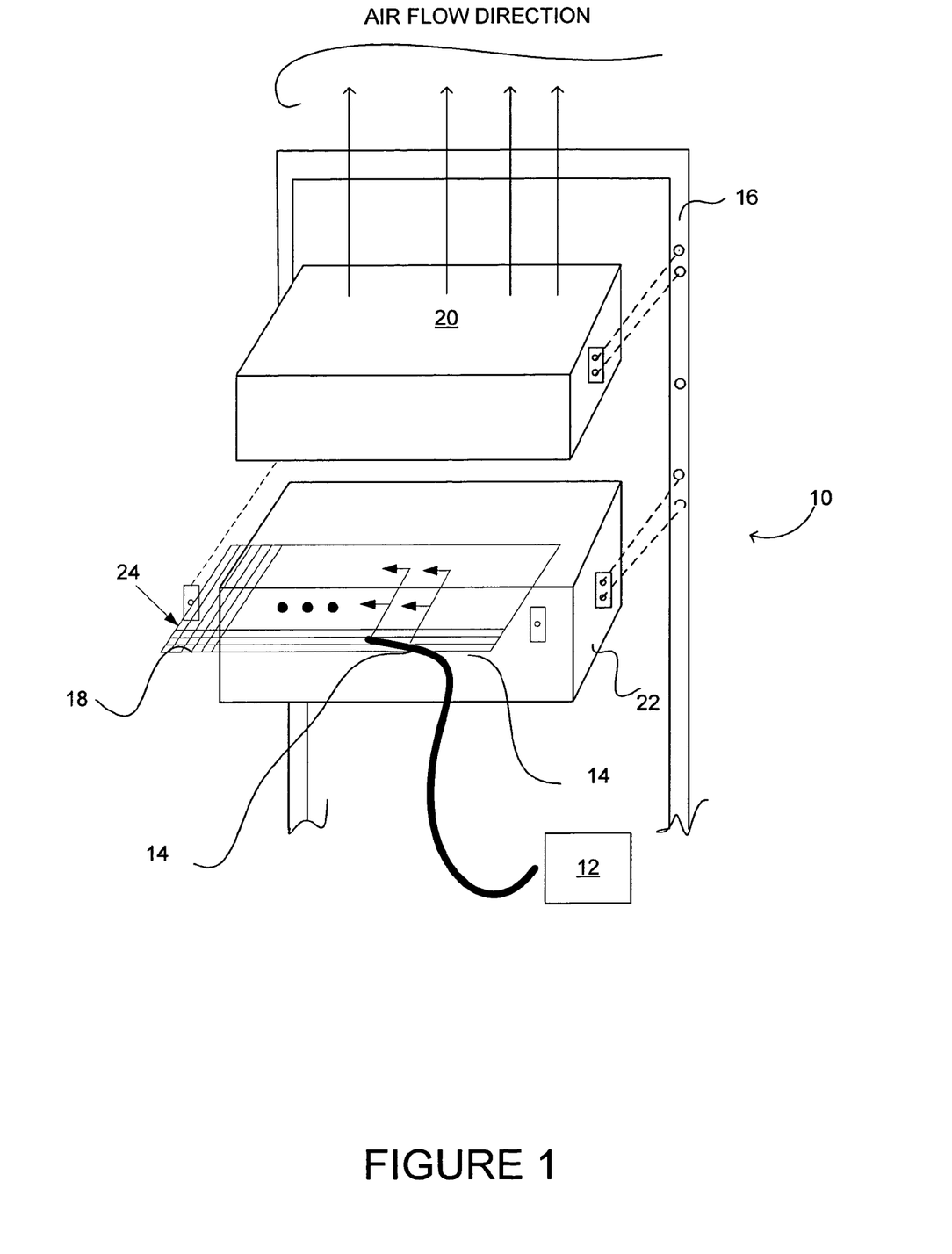
FIG. 1 illustrates an airflow sensor assembly within a rack assembly in exploded view positioned between two electronic equipment, one of which could be a fan tray assembly, in accordance with the teachings of the present invention.

Referring now to FIG. 1, an airflow correlation system 10 is shown that includes a control unit 12 coupled to a plurality of anemometers 14 mounted on a rack 16. The control unit 12 is capable of indicating the maximum and minimum velocity of the airflow as measured by the anemometers 14. The anemometers used in the array can be, for example, hot-wire (or hot-film) anemometers, though alternate types of anemometer or other flow velocity meters may be used. In a feedback embodiment that is intended to be used during actual operation of the equipment, an anemometer that does not itself produce heat may be desirable, so as not to place an additional load on the cooling system. In this regard, hot-wire anemometers may not be suited to such an in-situ operation and other types of anemometers or flow velocity meters (e.g. MEMS (microelectromechanical systems) devices) may be preferred. With respect to the electronic measuring elements, a variety of components or elements can be utilized without limiting the scope of the present invention. For example, in the present embodiment, the electronic measuring elements are the anemometers 14, such as those supplied by Cambridge.

The anemometers 14 are secured to a wire mesh tray 18 and the tray 18 is secured to the rack 16 and positioned between two equipment to measure airflow velocity, such as equipment 20 and 22. The equipment 20 and 22 are also secured to the rack 16.

The tray 18 can be made of a variety of perforated materials that allow for nearly unrestricted airflow. In one embodiment, the tray 18 is made of a wire mesh material that allows for airflow to occur with negligible change in the airflow volume. The electronic measuring elements, such as the anemometers 14 that are secured to the tray 18, can be positioned in a variety of locations on the tray 18. Furthermore, the electronic measuring elements can have any desired orientation on the tray 18, such as parallel or perpendicular or any other orientation there between. This allows for the best performance in measuring airflow volume/velocity and temperature depending on the specific application and the specific location within the rack 16 as configured in the field or the testing environment.

Once the airflow velocity is established and the differences in airflow velocity have been minimized, as detailed below, a rack airflow sensor assembly (RASA) 24 that includes the tray 18 containing the anemometers 14, which are coupled to or in communication with the control unit 12, can measure and record the airflow velocity that the circuit of the electronic equipment 20 and 22 experience during the qualification process. The anemometers are arranged to be in electronic communication with the controller, either via a wire connection or via wireless communication. As shown in this embodiment, the RASA 24 is coupled to the control unit 12 via a physical connection. In alternative embodiments, the RASA 24 is designed to be in communication with the control unit 12 via a wireless link. The airflow velocity can then be correlated to the bit-error rate (BER) that are recorded during the qualification process in order to determine the threshold operating limits based on maximum temperature and minimum airflow velocity.

As errors are measured, they may be compiled as statistics, such as, for example, Bit Error Rates (BER). Meanwhile, airflows may be measured and correlated with the error statistics, by the controller or another computer. In accordance with the measured errors and measured airflows, an airflow specification can be set for the system. By way of example, for BERs less than a threshold amount, airflow can be assumed to be sufficient. The measured airflow for that level of BER can be set as the specified airflow for that configuration. Additionally, the measured airflow can be correlated to a known output level of the fan array for that configuration. Thus, an input airflow specification can be set. Alternately, an alarm signal may be produced when the error rate exceeds a threshold limit or when a measured airflow rate is lower than a threshold limit.

Figure 2:
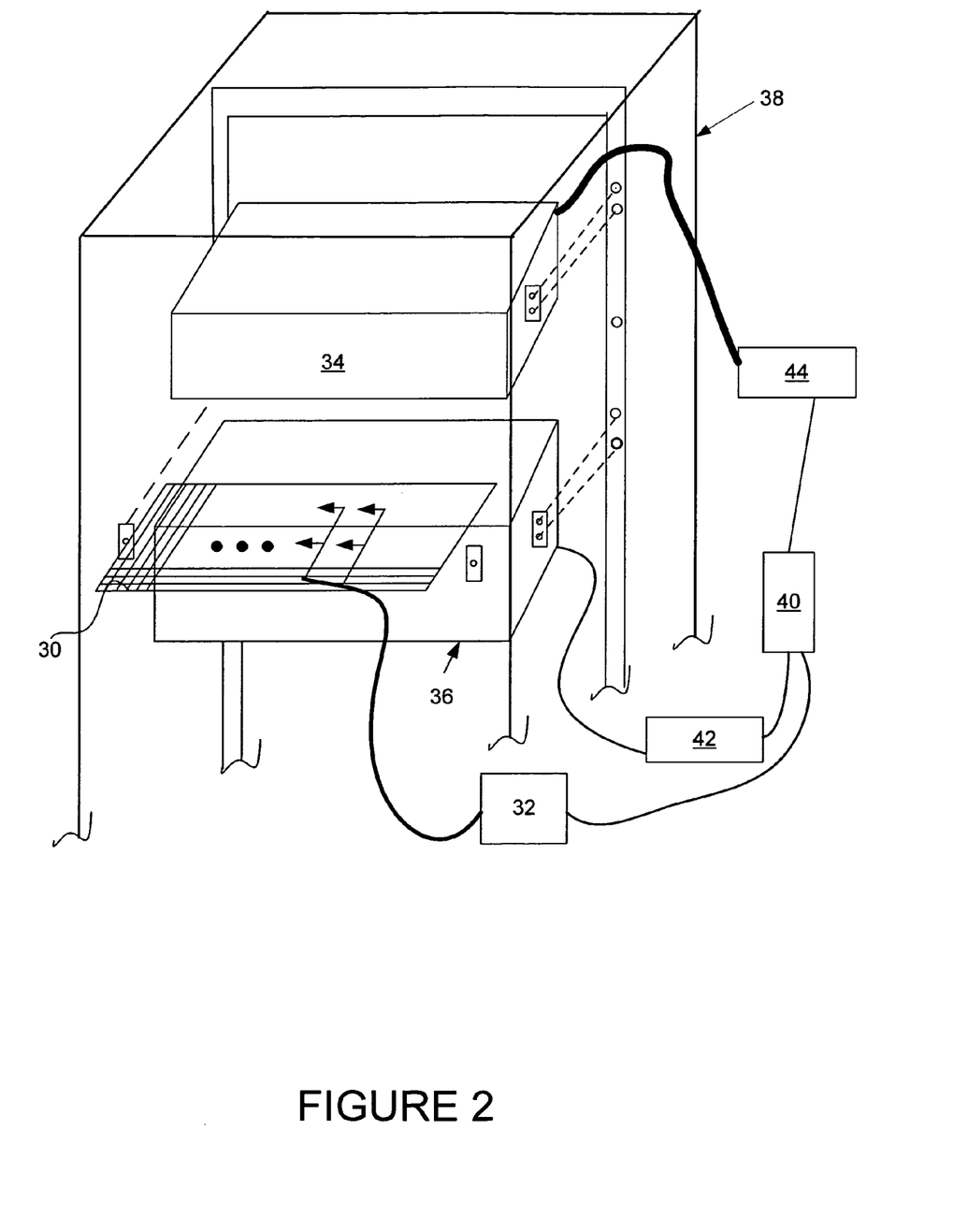
FIG. 2 illustrates an airflow sensor assembly within a testing environment in accordance with the teachings of the present invention.

Referring now to FIG. 2, in one embodiment, a RASA 30 is coupled to a control unit 32. The RASA 30 is located between an equipment 34 and a fan tray assembly 36 within an environmental chamber 38. The fan tray assembly 36 includes a plurality of fans (not shown), which are variable speed fans. The chamber 38 is used to simulate field conditions for testing purpose. In alternative embodiments the RASA 30 can be deployed in the field instead of the chamber 38 for monitoring the equipment 34. During the testing and qualification process, the chamber 38 can vary the temperature from −40 C. to +70 C.

The RASA 30 can measure the airflow velocity in Liner Feet per Minute (LFM) in order to determine an acceptable LFM range or rate for the purpose of qualification of the equipment 34. The RASA 30 can measure in any unit of measure that represents velocity variable. During qualification, the chamber 38 can cycle the temperature from −40 C. to +70 C. In the chamber 38, the RASA 30 measures the airflow velocity and the temperature in order to determine the location of hot-spots. The location of the hot-spots can be determined and correlated to the BER as discussed below.

In various embodiments the RASA 30 can either measure the airflow rate or the temperature. Furthermore, two or more RASA assemblies can be included in the chamber 38 that can independently measure either the airflow rate or the temperature at various locations as well as measuring either or both of these parameters.

Typically, hot-spots result from insufficient airflow at a given location in the equipment rack; this results in increased temperature and increased BER. The typical cause of inadequate airflow is the result of air that escapes between the gaps as the fans force the air through the various equipment on the rack. The air escapes because one of the equipment blocks the path of airflow and, hence, the airflow seeks the path of least resistance, which results in air escaping from between the equipment. The RASA 30 is used to measure the airflow at various locations in order to determine the location of hot-spots caused by various design problems that result in the airflow path being blocked or air escaping.

In one embodiment of the present invention, the fan tray assembly 36 can be controlled via a feedback loop using the airflow value readings from the RASA 30 as an input. In particular, overall airflow through the system can be controlled by controlling the fan tray assembly 36. Alternately, by configuring the fans to be separately controllable, airflow to a particular region of the system can be increased or decreased depending on the measured airflow in that region. For example, in some cases, equipment specifications include a requirement for a certain airflow in order to maintain proper temperatures. It is common, for example, to rate components for use at up to 85° C. in still air. In other cases, the specified level may be one set by the user rather than the equipment manufacturer.

Referring again to FIG. 2, the control unit 32 is coupled to a computer 40. The measurements from the RASA 30 are sent to the computer 40 through the control unit 32. The computer 40 is coupled to a fan speed control box 42 and an analyzer unit 44. The box 42 is coupled to the fan tray assembly 36. The fan tray assembly 36 in one embodiment is located at the bottom of the chamber 38 and forces air from the bottom to the top of the chamber 38 at various rates or velocities. The variable speed fans located on the fan tray 36 are controlled by the box 42 in response to input from the computer 40 based in part on information received from the unit 44 relating to the BER of the electronic equipment, such as equipment 34. The speed of the fan is increased in incremental steps as defined by the program parameters residing on the computer 40. The fan speed controls the airflow velocity, which can be measured in any unit; in this embodiment the airflow is measured in LFM and each fan located on the fan tray 36 can generate a flow rate of up to 100 Cubic Feet per Minute (CFM) in this embodiment. Various fans speed and types are contemplated and the scope of the present invention is not limited by the actual type or the variable speed range of the individual fans.

In one example, the box 42 is configured to display and/or store the velocity measurements. Further, the box 42 can be configured to produce a report, either via a visual display on the controller itself, as a printed output, or via connection to a computer, such as a general purpose computer that can compile, display and/or print the report. The report can, for example, include information about a minimum measured air velocity and a maximum measured air velocity. Furthermore, the box 42 may include and/or be in communication with electronic elements for monitoring system errors present in the electronic equipment. In one example of such an embodiment, the box 42 and separate system error monitoring equipment are each in communication with a general purpose computer that is programmed to display, store and/or print the measurements made by each type of monitor.

During testing or qualification process, analysis programs residing and operating on the computer 40 analyze the BER measured by the unit 44 for the equipment 34. It will be apparent to one of ordinary skill in the art that detecting BERs requires the use of expensive and complicated equipment; this detection is typically performed by qualification engineers during the testing or qualification environment instead of equipment installers or assemblers in the field. If the BER exceeds a certain predefined threshold level, then the computer 40 can control the speed of the fans to increase the airflow rate. The process of determining the airflow is discussed in detail below.

The foregoing process of measuring the BER and determining the necessary fan speed in order to increase the airflow rate can be utilized in an environmental test chamber to determine what airflow velocity and temperature is needed to prevent the BER increasing beyond equipment threshold limits that result in failure of the equipment in the field during operation. Thus, even thought the overall temperature of the rack assembly within the field or the test environment falls within the allowable temperature ranges, it is still possible to have equipment failure due to overheating. This is in part cause by poor airflow at specific location in the equipment assembly rack. In order to locate and solve the problem of localized temperature increases or hot-spots, the airflow velocity at various location throughout the equipment assembly rack is measured.

When the BER for a particular equipment increases beyond the allowable level due to overheating, even though the overall temperature of the equipment assembly rack is within allowable temperature ranges, the cause of the overheating and its location need to be determined in order to design a solution. For example, with reference to FIG. 3, an equipment 50 positioned in a rack assembly 51 (shown without the rack) blocks the vertical flow of air and thereby cause the air to be diverted out of the rack assembly 51 through the gap 52 instead of through the equipment 50 and then to an equipment 54. The flow of the air through the gap 52 means that there is insufficient airflow reaching the equipment 54, which results in hot-spots at the equipment 54. Thus, although the temperature in the chamber (not shown) may be within the allowed tolerances, the temperature at the hot-spot typically exceeds the allowed qualification limits due to inadequate airflow. Thus, a minimum acceptable airflow rate at the hot-spot can be determined so that during deployment in the field location or within the assembly housing, each equipment is qualified at a specific air flow rate.

If the installer determines that the minimum airflow requirements are not satisfied, then the installer can either reposition the equipment as allowed by the design parameters in the rack if it is determined that a hot-spot exists. Alternatively, if the equipment can not be repositioned due to design restrictions, then an additional fan assembly trays or fans are added in order to increase the airflow.

Figure 3:
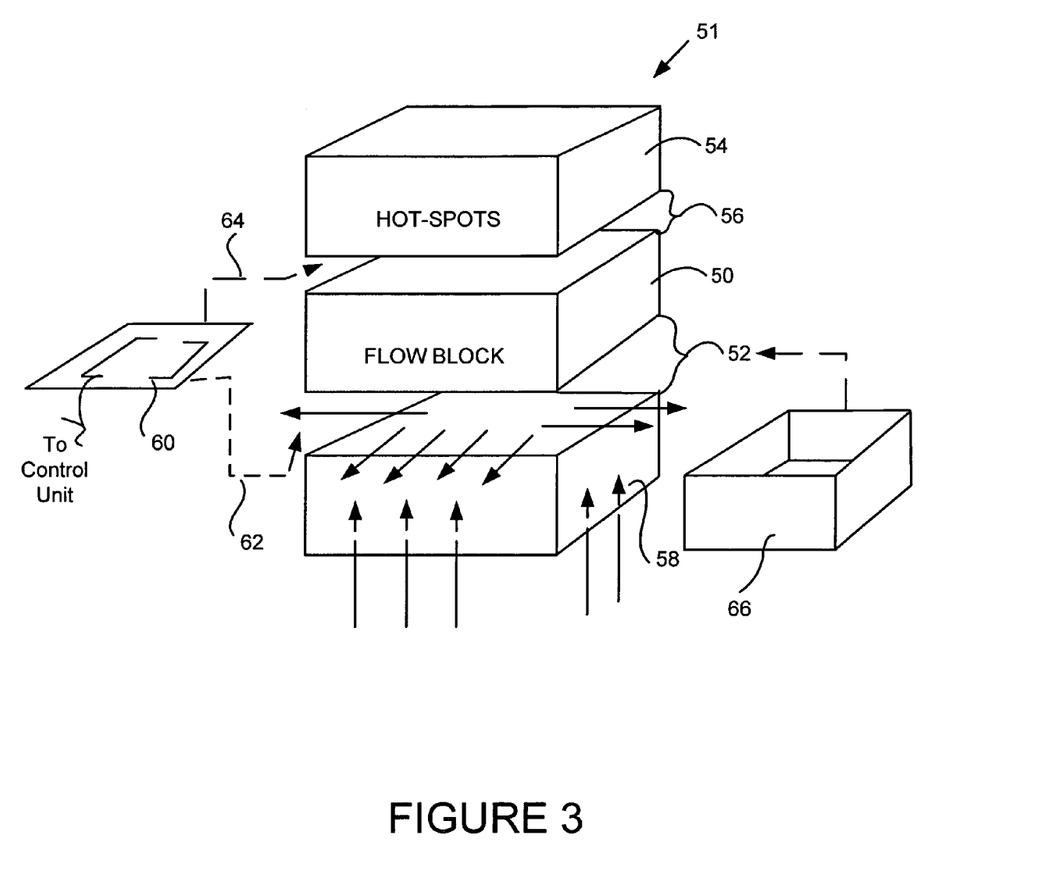
FIG. 3 illustrates the creation of hot-spots due to airflow blocking caused by certain equipment in accordance with the teachings of the present invention.

In order to determine the location of the hot-spots due to the inadequate airflow, the RASA 60 is positioned in the gap 52, as shown by the path 62. The RASA 60 measures the airflow and the temperature at the gap 52. Then the RASA 60 can be re-positioned in a gap 56, as shown by path 64 and the airflow and temperature at gap 56 can be determined. Once the RASA 60 measures the airflow and temperature, then the system, as detailed below, can analyze this information along with the BER being detected for the equipments 50 and 54. The equipment 50 is receiving adequate airflow velocity and, hence, the BER will be within the allowable BER range. On the other hand, it is possible that the BER will exceed the allowable values for the equipment 54. Consequently, the system, based on data gathered by the control box (not shown) that is coupled to the RASA 60, will identify the hot-spots as being located at the equipment located directly above or "downstream" from the equipment 50 and a design correction can be determined. One approach to resolving the problem would be to reposition equipment that interferes with airflow, such as the equipment 50, downstream from all other equipment. Thus, in this example, equipment 50 would be repositioned above equipment 54 in the rack assembly (not shown).

In some rack assemblies, there may not be any one particular equipment that is blocking the airflow, even though the airflow is escaping through the gaps located between the equipment. This is mainly due to the fact that the airflow seeks the path of least resistance. In such circumstances there is a need to prevent the airflow from escaping through the gaps and being forced through the equipment. Consequently, in accordance with the present invention, an air duct 66 can be created and placed between equipment 50 and 54 or between equipment 50 and 58. The air duct 66 encloses the air passage way between equipment to prevent the air from escaping and, thus, forcing the air to flow through the downstream equipment. A variety of materials can be used to enclose the gap and the scope of the present invention in not limited thereby. Alternatively, the air duct can be designed to carry air from the fan tray assembly to the exact location of the hot spot, which could be from the fan tray assembly located at the bottom of the rack assembly directly to an equipment positioned near the top of the rack assembly and thereby bypassing the other equipment.

Figure 4:
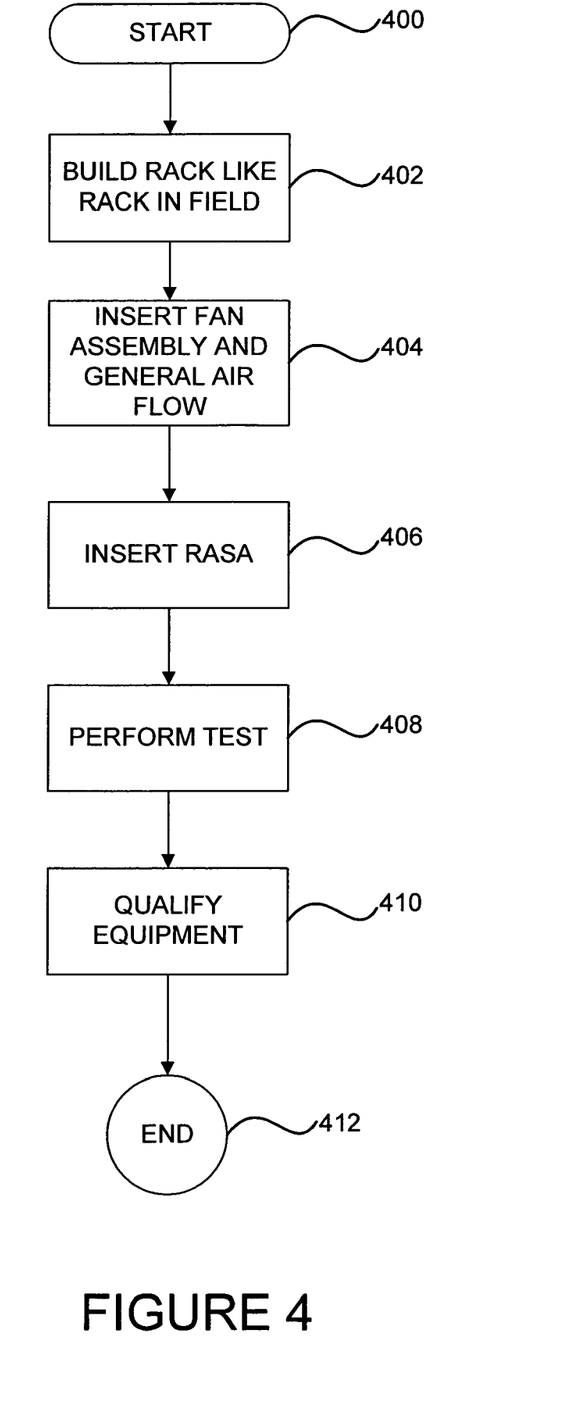
FIG. 4 is a flow chart for qualification or certification of equipment in accordance with the teachings of the present invention.

Referring now to FIG. 4, the process of testing the equipment in the environmental test chamber in order to qualify equipment based on airflow and temperature begins at step 400. At step 402, a rack of electronic equipment is configured similar to the rack configuration for the electronic equipment that will be or is currently deployed in the field. At step 404, the fan tray assembly is inserted and the airflow is generated. The fan tray assembly includes the control unit that allows for the fan speed and, hence, the airflow velocity to be controlled. At step 406 the rack airflow sensor assembly is inserted in a desired location to measure the airflow velocity and temperature at that location. With the RASA in a fixed location the airflow velocity is varied until the BER of the equipment exceeds the threshold number. At step 408 the temperature of the test environment is cycled and BER is continuously measured. At step 410 the equipment is certified, based on the threshold level, at a maximum temperature and minimum airflow velocity based on the measured performances.

Figure 5:
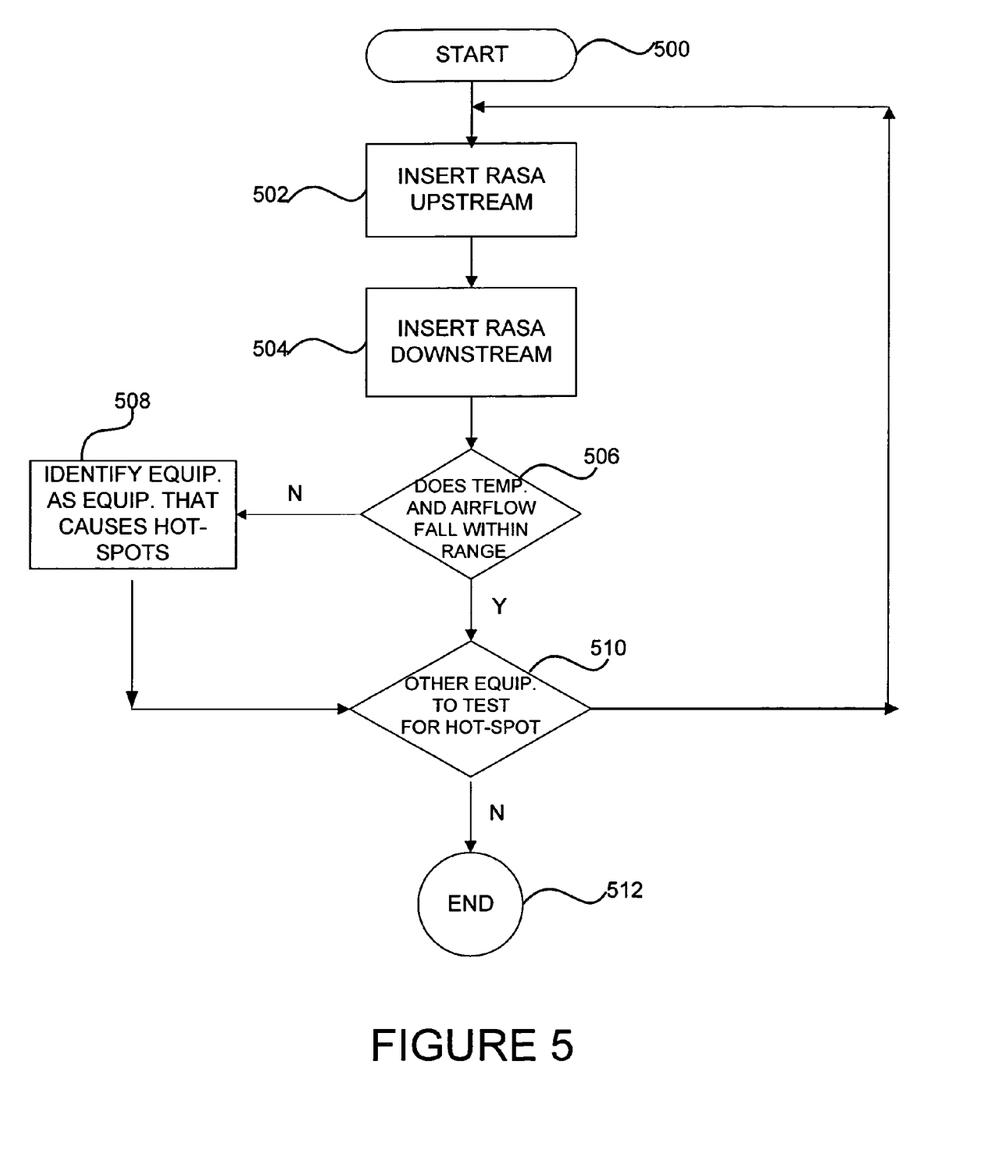
FIG. 5 is a flow chart for determining the location of hot-spots within an equipment rack assembly in accordance with the teachings of the present invention.

Referring now to FIG. 5, the process of locating hot-spots within a rack assembly begins at step 500. At step 502, the RASA is inserted below the equipment being tested for airflow and temperature problems. Temperature and airflow parameters are varied by increasing or decreasing the fan speeds and corresponding measurements are recorded by the RASA. At step 504, the RASA is inserted above the equipment being tested and again the airflow and temperature in the test environment is varied. At step 506 it is determined what difference exists between the measurement taken with the RASA below or upstream compared to the RASA positioned above or downstream from the equipment. If the temperature and airflow velocity combinations fall outside a predetermined allowable range, then at step 508 the equipment is identified as being capable of causing a hot-spot. At step 510 it is determined if there are other equipment to be tested; if so then the process returns to step 502 where the RASA is positioned upstream from the next equipment to be tested; otherwise the process ends at step 512.

In alternative embodiments, equipment configurations from the field are replicated in the test environment in order to locate and further reduce the impact of hot-spots, especially in rack configurations that can not be altered. For example, electronic equipment that contribute to hot-spot problems can be identified and other equipment located downstream from the hot-spots causing equipment can be equipped with designated fan tray assemblies or an individual fan that can increase airflow velocity in the hot-spot and help prevent overheating. These additional fans can be designed to turn on when a threshold BER rate, a threshold airflow, or a threshold temperature is reached.

In the embodiments set forth herein, the direction of the airflow is described as moving from the bottom of the assembly rack to the top. However, in alternative embodiments the airflow can be from the top of the rack to the bottom. Furthermore, in addition to the fan tray assembly being capable of forcing air in a particular direction, alternative embodiments can be designed where a pair of fan tray assemblies work in conjunction; one tray assembly force or pushes the air and the other, which would be located at an opposite end and downstream, draws or pulls the air.

Figure 6:
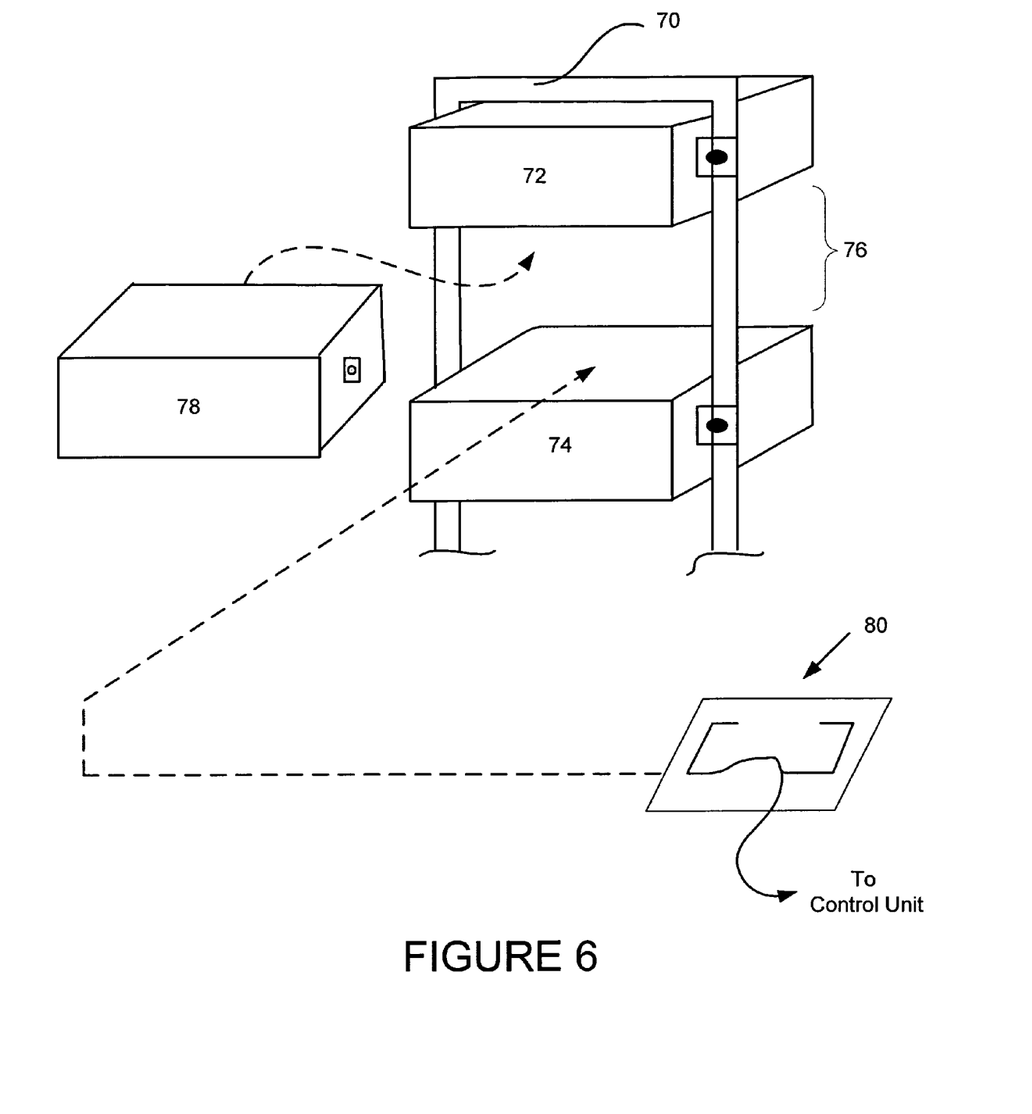
FIG. 6 illustrates an equipment installed within a vacant position in a rack assembly and tested using an airflow sensor in accordance with the teachings of the present invention.

Referring now to FIG. 6, a rack assembly 70 is deployed in the field with equipment 72 and 74. The number of equipment in the rack and the position of the equipment is merely and example and not intended as a limitation. Any number of equipment as well as any combination of positions can be considered and are within the scope of the present invention. The equipment 72 and 74 are separated by a gap 76. Any compatible telecommunication equipment can be position in the gap 76.

In this example, if the system designer determines that an equipment 78 needs to be added to the rack assembly 70, then that equipment is positioned in the rack assembly 70 by an equipment installer in the field. The equipment 78, as well as the equipment 72 and 74, has been previously qualified during testing and qualification, as discussed above, at a minimum airflow rating and maximum temperature rating. Thus, once the equipment 78 is positioned in the rack assembly 70, the installer inserts a RASA 80 in various locations throughout the rack, such as upstream and downstream from each of the equipment, in order to determine if the minimum airflow requirement for each of the equipment is satisfied.

When embodiments of the present invention are used for the purpose of system qualification, hot-wire anemometers do not present a significant problem regarding heat production and so may be freely employed. In this embodiment, the electronic equipment is monitored for errors generated. For example, a monitor (e.g. a processor) may record bit error rates in information transmitted through the equipment. Such a monitor may be external to the electronic equipment system, or may be incorporated within one or more of the pieces of equipment, or, as noted above, in the box 42. The measured errors can be generated as a result of temperature-induced faults as well as other sources of error.

An embodiment of the invention may be implemented in part or in whole as a hard-wired circuit (e.g. implemented on a computer interface card) and/or as a circuit configuration fabricated into one or more arrays of logic elements arranged sequentially and/or combinatorially and possibly clocked (e.g. one or more integrated circuits (e.g. ASIC(s)) or FPGAs). Likewise, an embodiment of the invention may be implemented in part or in whole as a firmware program loaded or fabricated into non-volatile storage (such as read-only memory or flash memory) as machine-readable code, such code being instructions executable by an array of logic elements such as a microprocessor or other digital signal processing unit.

Having fully described various embodiment and various alternatives, those skilled in the art will recognize, given the teachings herein that numerous alternatives and variations exist that do not depart from the invention. Thus, the present invention is not intended to be limited to the embodiments shown above but rather is to be accorded the widest scope consistent with the principles and novel features disclosed in any fashion herein.

What is claimed is:

1. A system for qualification of an electronic equipment installed in a rack assembly, the system comprising:
    a detection unit positioned within the rack assembly for measuring air velocity; and
    a computer system coupled to the detection unit for monitoring and correlating the air velocity with bit error rates of the electronic equipment as the air velocity increases and decreases over a period of time and including
    an error detection unit for detecting bit errors in order to determine the bit error rate of the equipment at a particular air velocity and thereby qualify the electronic equipment at a minimum air velocity.

2. The system of claim 1 wherein the detection unit comprises:
    a mesh tray for allowing unrestricted airflow;
    a plurality of anemometers secured to the mesh tray for measuring air velocity; and
    a control unit coupled to each of the plurality of anemometers for recording the measured air velocity.

3. The system of claim 1 wherein the computer system comprises an analysis program resident on the computer system for receiving the measured air velocity from the detection unit and the measured bit error rate of the equipment at that particular air velocity and comparing the bit error rate at the measured air velocity to a maximum bit error rate in order to determine the minimum air velocity that is allowed prior to exceeding the maximum bit error rate.

4. The system of claim 1 further comprising a fan assembly tray that is deployed and coupled to the rack assembly for increasing airflow near the deployed equipment in response to detection of hot-spots caused by the insertion of the deployed equipment.

5. The system of claim 4 further comprising a control unit coupled to the fan assembly tray for controlling the speed of the variable speed fan in response to changes in the operating temperature of the equipment.

6. The system of claim 1 further comprising means for enclosing a gap defined between a pair of equipment in the rack assembly.

7. A method of qualifying electronic equipment located within a rack assembly with respect to air velocity and temperature, the method comprising the steps of:
    inserting a sensing unit within a rack assembly;
    varying the air velocity through the rack assembly; and
    measuring the bit error rate of the electronic equipment in order to determine the minimum air flow rate needed to qualify the equipment at a maximum bit error rate.

8. The method of claim 7 comprising the steps of:
    installing the equipment within a vacant slot in the rack assembly;
    measuring the air flow upstream of the equipment in order to determine the upstream air flow;
    measuring the air flow downstream from the equipment in order to determining the downstream air flow; and
    determining if the upstream or the downstream air flow fall below a minimum air flow.

9. The method of claim 7 further comprising the steps of:
    producing airflow in a housing that includes a signal processing system;
    measuring at least one corresponding airflow value at a position within the housing;
    detecting errors produced by the signal processing system; and
    correlating the measured airflow value with the detected errors.

10. The method of flow analysis according to claim 9, the method further comprising the steps of determining, based on the measured airflow values and the detected errors, a minimum operating airflow for the signal processing system.

11. The method of flow analysis according to claim 10, wherein the step of determining comprises the steps of:
    comparing a rate of the detected errors to a predetermined threshold error rate; and
    setting the minimum operating airflow at least equal to a measured airflow value correlated with the error rate.

12. The method of flow analysis according to claim 9, further comprising the steps of:
    determining a rate of the detected errors; and
    producing an alarm signal, when the rate of detected errors exceeds a threshold value.

13. The method of claim 7 comprising the steps of:
    producing airflow in a housing enclosing a plurality of electronic components;
    measuring at least one corresponding airflow value at each of a plurality of positions within the housing; and
    determining the existence of a reduced airflow region within the housing based on the measured airflow values.

14. An apparatus for measuring airflow in a housing enclosing a plurality of electronic components, said apparatus comprising:
    an array of airflow measuring devices located within the housing and configured to measure airflow at a plurality of positions within the housing;
    a controller in communication with the array of airflow measuring devices and configured to receive signals therefrom;
    an error monitoring device configured to detect errors in at least one signal produced by the plurality of electronic components; and
    a processor configured and arranged to correlate airflows measured by the airflow monitoring devices with errors detected by the error monitoring device.

15. The apparatus for measuring airflow according to claim 14, wherein the array includes a plurality of anemometers, each of the plurality of anemometers comprising one of a hot-wire anemometer and a hot-film anemometer.

16. The apparatus for measuring airflow according to claim 14, wherein the processor is configured to determine a minimum operating airflow for the housing based on the measured airflow values and the detected errors.

17. The apparatus for measuring airflow according to claim 16, wherein the processor is configured to compare a rate of the detected errors to a predetermined threshold error rate and to set the minimum operating airflow at least equal to a measured airflow value correlated with a rate of the detected errors.

18. The apparatus for measuring airflow according to claim 14, wherein said processor is configured to control the produced airflow to obtain a minimum airflow velocity associated with a threshold rate of the detected errors.

19. The apparatus for measuring airflow according to claim 14, wherein said processor is configured to determine a rate of the detected errors and to produce an alarm signal, when the error rate exceeds a threshold value.

20. The apparatus for measuring airflow according to claim 14, wherein said processor is configured to produce an alarm signal when at least one measured airflow value is lower than a corresponding threshold value.

* * * * *